United States Patent
Chen et al.

(10) Patent No.: US 7,550,370 B2
(45) Date of Patent: Jun. 23, 2009

(54) METHOD OF FORMING THIN SGOI WAFERS WITH HIGH RELAXATION AND LOW STACKING FAULT DEFECT DENSITY

(75) Inventors: Huajie Chen, Danbury, CT (US); Stephen W. Bedell, Wappingers Falls, NY (US); Devendra K. Sadana, Pleasantville, NY (US); Dan M. Mocuta, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/597,066

(22) PCT Filed: Jan. 16, 2004

(86) PCT No.: PCT/US2004/001555

§ 371 (c)(1),
(2), (4) Date: Jul. 10, 2006

(87) PCT Pub. No.: WO2005/078786

PCT Pub. Date: Aug. 25, 2005

(65) Prior Publication Data

US 2007/0128840 A1    Jun. 7, 2007

(51) Int. Cl.
 *H01L 21/00* (2006.01)
(52) U.S. Cl. .................. 438/493; 438/494; 438/455
(58) Field of Classification Search .......... 438/493, 438/455, 494
See application file for complete search history.

(56) References Cited

U.S. PATENT DOCUMENTS

| | | | |
|---|---|---|---|
| 4,409,260 A * | 10/1983 | Pastor et al. | 438/765 |
| 5,698,869 A | 12/1997 | Yoshimi et al. | |
| 6,066,576 A * | 5/2000 | Thakur et al. | 438/787 |
| 6,117,750 A | 9/2000 | Bensahel et al. | |
| 6,271,152 B1 * | 8/2001 | Thakur et al. | 438/770 |
| 6,429,098 B1 | 8/2002 | Bensahel et al. | |
| 6,551,889 B2 | 4/2003 | Kovacic | |
| 6,861,158 B2 * | 3/2005 | Bedell et al. | 428/641 |
| 7,026,249 B2 * | 4/2006 | Bedell et al. | 438/706 |
| 7,084,050 B2 * | 8/2006 | Bedell et al. | 438/480 |
| 7,183,229 B2 * | 2/2007 | Yamanaka | 438/795 |
| 7,235,812 B2 * | 6/2007 | Chu et al. | 257/65 |
| 2002/0185686 A1 | 12/2002 | Christiansen et al. | |
| 2003/0013280 A1 * | 1/2003 | Yamanaka | 438/487 |

(Continued)

*Primary Examiner*—Laura M Menz
(74) *Attorney, Agent, or Firm*—Yuanmin Cai

(57) ABSTRACT

A method of forming a silicon germanium on insulator (SGOI) structure. A SiGe layer is deposited on an SOI wafer. Thermal mixing of the SiGe and Si layers is performed to form a thick SGOI with high relaxation and low stacking fault defect density. The SiGe layer is then thinned to a desired final thickness. The Ge concentration, the amount of relaxation, and stacking fault defect density are unchanged by the thinning process. A thin SGOI film is thus obtained with high relaxation and low stacking fault defect density. A layer of Si is then deposited on the thin SGOI wafer. The method of thinning includes low temperature (550° C.-700° C.) HIPOX or steam oxidation, in-situ HCl etching in an epitaxy chamber, or CMP. A rough SiGe surface resulting from HIPOX or steam oxidation thinning is smoothed with a touch-up CMP, in-situ hydrogen bake and SiGe buffer layer during strained Si deposition, or heating the wafer in a hydrogen environment with a mixture of gases HCl, DCS and $GeH_4$.

11 Claims, 10 Drawing Sheets

U.S. PATENT DOCUMENTS

| | | |
|---|---|---|
| 2003/0089901 A1 | 5/2003 | Fitzgerald |
| 2004/0241460 A1* | 12/2004 | Bedell et al. ................ 428/446 |
| 2004/0242006 A1* | 12/2004 | Bedell et al. ................ 438/692 |
| 2005/0153487 A1* | 7/2005 | Bedell et al. ................ 438/149 |
| 2006/0054891 A1* | 3/2006 | Chu et al. ................ 257/65 |
| 2007/0087492 A1* | 4/2007 | Yamanaka ................ 438/166 |
| 2007/0128840 A1* | 6/2007 | Chen et al. ................ 438/493 |
| 2007/0218647 A1* | 9/2007 | Chu et al. ................ 438/455 |

* cited by examiner

METHOD OF FORMING THIN SGOI WAFERS WITH HIGH RELAXATION AND LOW STACKING FAULT DEFECT DENSITY

CROSS REFERENCE TO RELATED APPLICATIONS

The present application is a National Phase Application of an International Application No. PCT/US04/01555, entitled "Method of Forming Thin SGOI Wafers with High Relaxation and Low Stacking Fault Defect Density", filed on Jan. 16, 2004, the content of which is incorporated herein by reference in its entirety.

TECHNICAL FIELD

The present invention generally relates to silicon germanium ($Si_{1-x}Ge_x$, for simplicity referred to as SiGe) on insulator (SGOI) structures and more particularly to an improved method of forming SGOI structures with a thin and highly relaxed SiGe layer, and with low stacking fault defect density.

BACKGROUND ART

In strained Si complementary metal oxide semiconductor (CMOS) applications, Si deposited on relaxed SiGe is tensily strained and used as channel material for both N-type field effect transistors (NFETs) and P-type field effect transistors (PFETs). The NFETs have significant mobility enhancement at strain of 0.6%; however, more than 1.2% of strain is required for significant PFET mobility enhancement. At the same time, similar to CMOS on Si on insulator (SOI) development, a thin Si/SiGe film on buried oxide (BOX) is very useful for high performance devices. In addition, stacking fault defects in the Si and SiGe material can cause source to drain shorts and need to be minimized.

As an example of the present state of the art, U.S. Patent Application Publication 2002/0185686 describes a process for fabricating a SGOI layer by growing a pseudomorphic epitaxial SiGe layer on top of SOI, implanting ions of light elements beneath the layer, and then performing a relaxation annealing process. U.S. Patent Application Publication 2002/0168802 describes a process for fabricating a combined SiGe/SOI structure, in which the top layer of SOI is converted to SiGe and then annealed.

One of the most promising methods to make SGOI wafers is thermal mixing. In thermal mixing, pseudomorphic SiGe film is deposited on SOI wafers, and a high temperature oxidation (1200° C.-1300° C.) intermixes SiGe with underlying Si, relaxes the SiGe, and makes the SiGe thinner at the same time. During the thermal mixing, Ge is rejected from the oxide at high temperatures, so the amount of Ge in SiGe layer is substantially conserved. For example, a 600 Å, 17% SiGe on SOI can be mixed to 400 Å, 25% SGOI, or to 1000 Å, 10% SGOI provided that initial SOI thickness is more than 400 Å.

However, SGOI film after thermal mixing is normally not 100% relaxed. In the above example, the 400 Å 25% SGOI is only 60% relaxed, which gives about 0.6% strain for Si deposited on this substrate. In order to have 1.2% strain, one will require 50% SiGe film if only 60% relaxation is achieved for SGOI. This high concentration SiGe film has many additional material issues and CMOS process integration issues compared with lower concentration materials, and is not desired. Thus, SiGe with relatively low concentration but high relaxation is required.

SUMMARY OF THE INVENTION

The present invention addresses these issues by providing an improved method of forming SGOI structures with a thin and highly relaxed SiGe layer, and with low stacking fault defect density. According to the present invention, a method of forming an SGOI structure begins by depositing a SiGe layer on an SOI wafer. Next, the invention performs a thermal mixing process that intermixes the SiGe layer with the underlying Si layer and partially relaxes strain within the SiGe layer. The thermal mixing process is usually carried out in an oxidizing environment and the amount of oxidation can be used to control the SiGe thickness after the thermal mixing. The invention then thins the SiGe layer to a desired final thickness. This thinning process keeps the Ge concentration, the amount of relaxation, and stacking fault defect density unchanged. This way, the invention is able to obtain a thin SGOI film with high relaxation, and with low stacking fault defect density. A surface smoothing process is carried out after thinning. Finally, the invention deposits Si on the thin SGOI wafer.

The process of thermally mixing the SiGe layer comprises heating the SiGe layer to approximately 1200° C.-1300° C. in an oxidizing environment. During such a high temperature oxidation process, Ge atoms are rejected from the oxide and accumulate in the SiGe layer under the oxide. The thinning process non-selectively thins the SiGe layer such that Si and Ge within the SiGe layer are removed according to their existing molar concentrations. More specifically, the thinning process can be a high pressure oxidation (HIPOX) process conducted at a temperature less than 700° C., a steam oxidation process conducted at a temperature of less than 700° C., an HCl etching process, or an chemical mechanical polishing (CMP) process. If the oxidation thinning process is used, the SiGe layer is substantially smoothed by a smoothing process after thinning and has a surface roughness of less than 15 Å, preferably less than 10 Å.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF THE INVENTION

Figure 1:
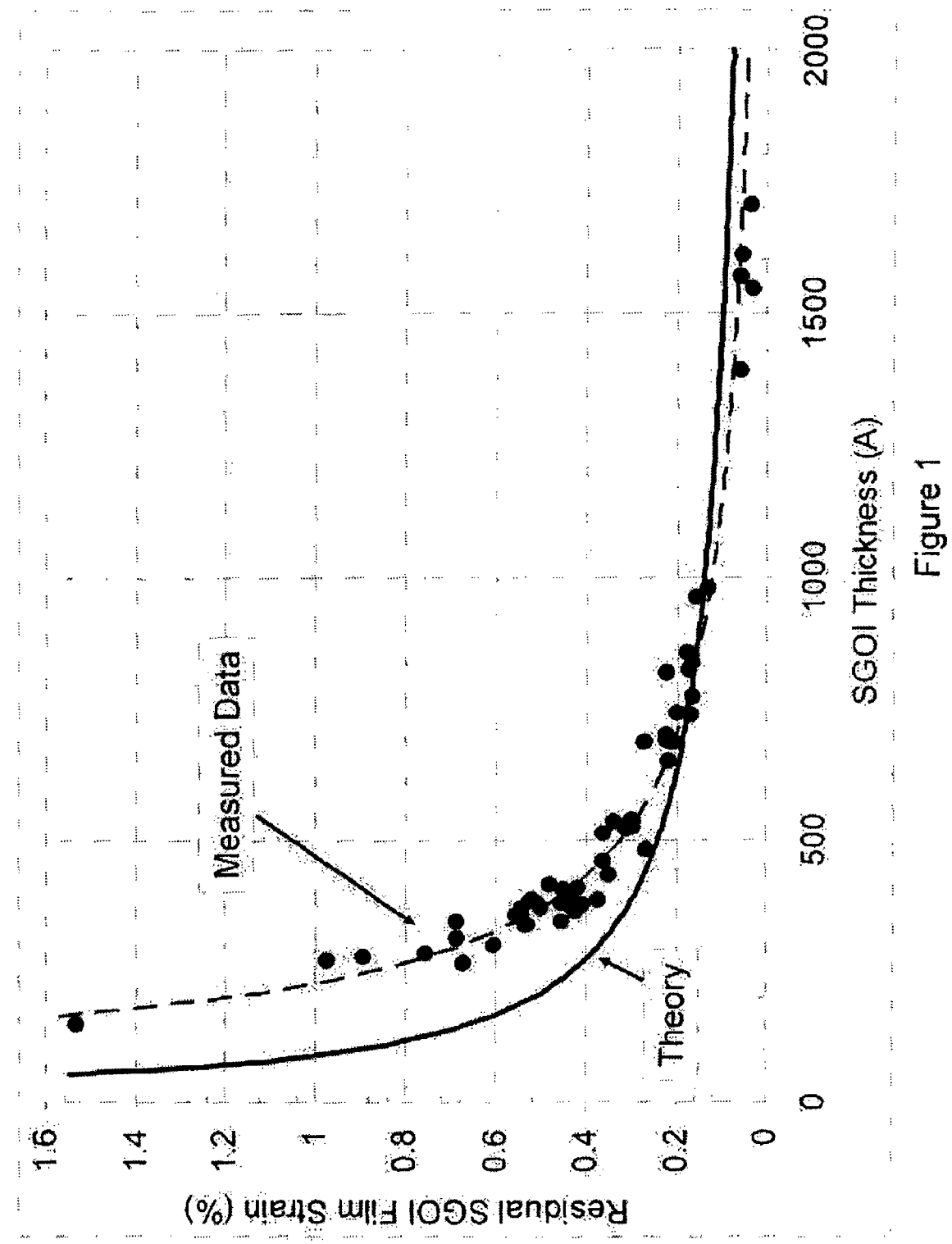
FIG. 1 shows relationship of the remaining strain in SGOI after thermal mixing and the SiGe thickness.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Figure 2:
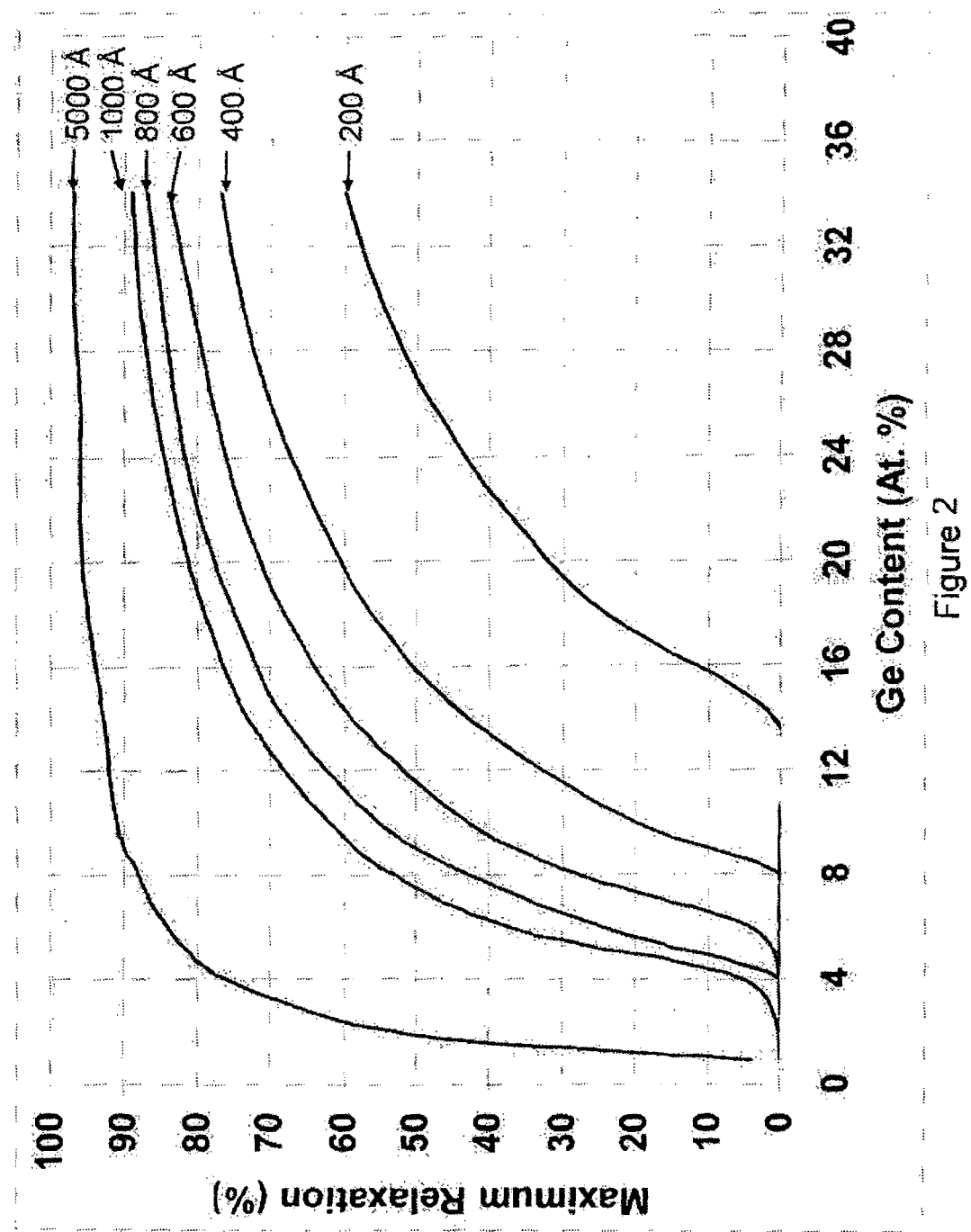
FIG. 2 shows the percentage of SGOI relaxation dependence on the Ge concentration and the SiGe thickness.

FIG. 1 shows the relationship of the remaining strain in SGOI after thermal mixing and the SiGe thickness. The dash curve shows experimental data, and the solid curve shows theoretical data. FIG. 1 shows that dislocation formation reduces strain in the SiGe film and that the film relaxes until strain energy is below the level necessary to form new dislocations. The theory and experimental data fit well down to SiGe thickness of 500 Å. Below 500 Å, experimental data shows more remaining strain, thus less relaxed than predicted by theory. FIG. 2 shows the percentage of SGOI relaxation dependence on Ge concentration and SiGe thickness as predicted by theory. As pointed out earlier, experimental data shows less relaxation than predicted by theory when SiGe film thickness is less than 500 Å. These data show that for a given Ge concentration, the percentage of relaxation increases when SiGe film thickness increases. For example, for 20% SiGe, the theory predicts 30% relaxation for 200 Å SiGe film, and 80% relaxation for 1000 Å SiGe film.

Figure 3:
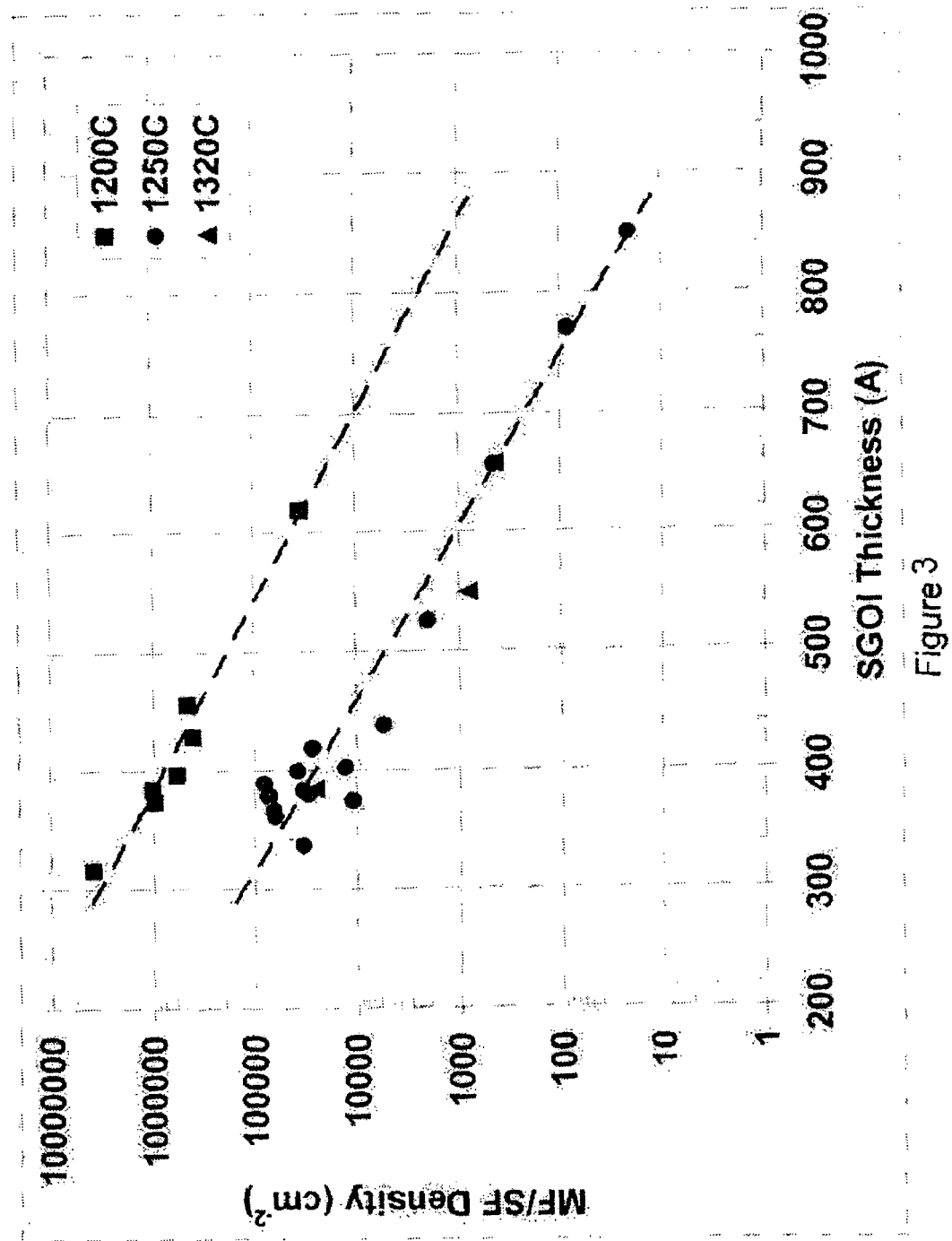
FIG. 3 shows relationship of the stacking fault defect density in SGOI and the SiGe thickness.

FIG. 3 shows the relationship of stacking fault defect density (a planar-type defect associated with an error in atomic order of the crystalline structure) in SGOI and the SiGe thickness found by the inventors. When SiGe film thickness is increased by 150 Å, the stacking fault defect density is reduced by one order of magnitude. For example, with the invention the SGOI has less than $1\times10^4/cm^2$ (preferably less than $1\times10^2/cm^2$) of stacking fault defects.

Thus, it is desirable to have a thick SGOI after thermal mixing to obtain SGOI material with high relaxation and low stacking fault defect density. However, as earlier described, a high performance device requires a thin final Si/SiGe film with the SiGe highly relaxed, which is difficult to obtain with conventional thermal mixing. The invention overcomes this limitation of the thermal mixing process as it relates to SGOI structures by thinning a thick thermally mixed SiGe layer.

Figure 4:
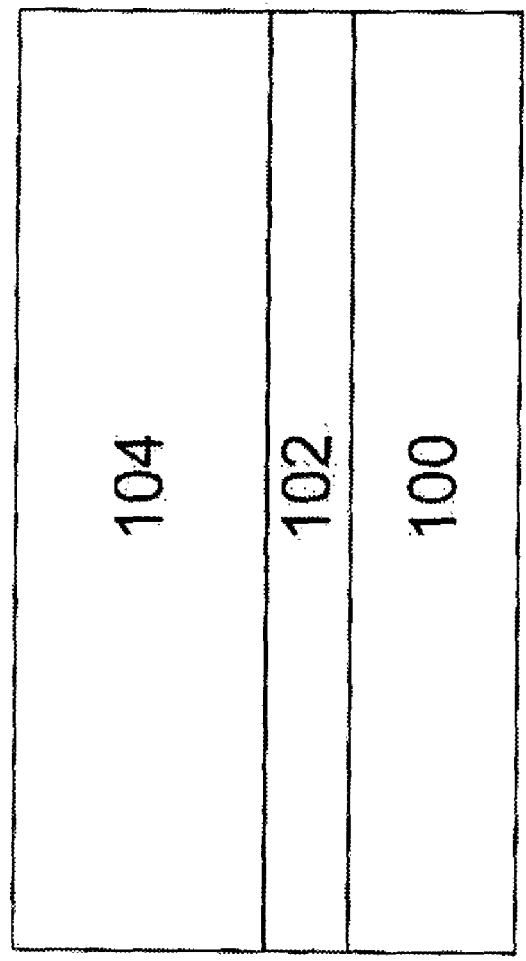
FIGS. 4-9 are schematic diagrams (through cross sectional views) illustrating the basic processing steps that are employed in the present invention.

More specifically, as shown in FIG. 4, the invention first deposits a SiGe layer 104 on an SOI 102 and 100, where 102 is Si layer and 100 is buried oxide (BOX). SiGe layer 104 can be with uniform Ge concentration, or have Ge concentration variation along the film thickness, such as including a Si buffer layer or cap layer.

Figure 5:
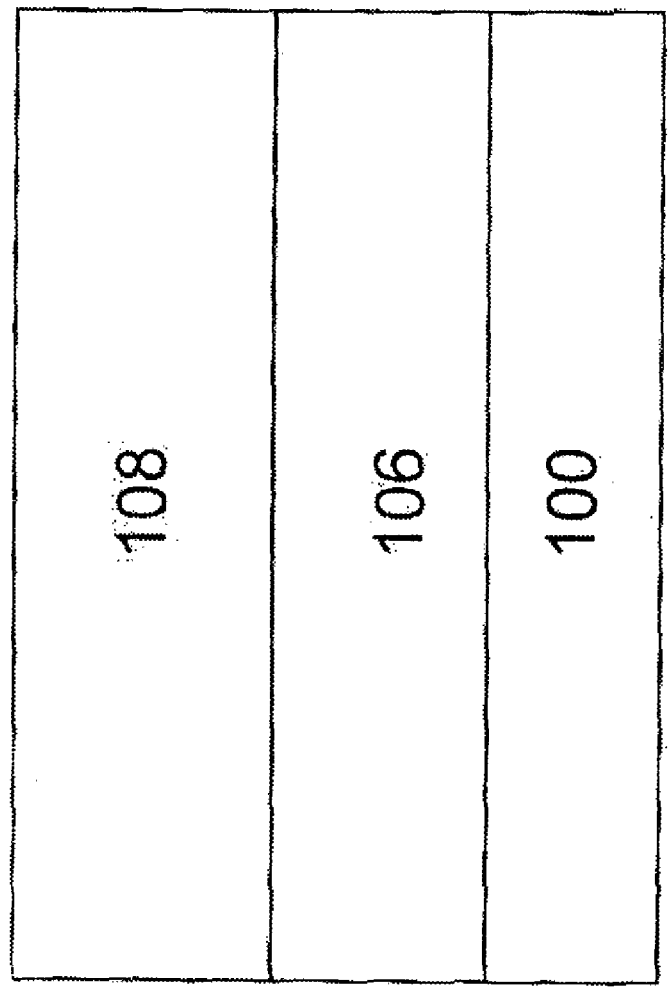

Next, as shown in FIG. 5, the invention performs thermal mixing of the SiGe and Si layers in an oxidizing environment at temperature range of 1200° C.-1300° C., which intermixes the SiGe and Si, at the same time oxidizes and thins the intermixed SiGe layer, and at the same time partially relaxes strain within the SiGe layer. As a result of the thermal mixing, a partially relaxed SiGe layer 106 is formed directly on top of BOX 100, and an oxide layer 108 is formed on top of the SiGe layer. Some internal oxidation may occur during thermal mixing; as a result, the thickness of BOX 100 may increase after thermal mixing. During this high temperature oxidation process, Ge is rejected from the oxide, so the amount of Ge in the SiGe layer 106 is substantially same as the SiGe layer 104 in FIG. 4.

Figure 6:
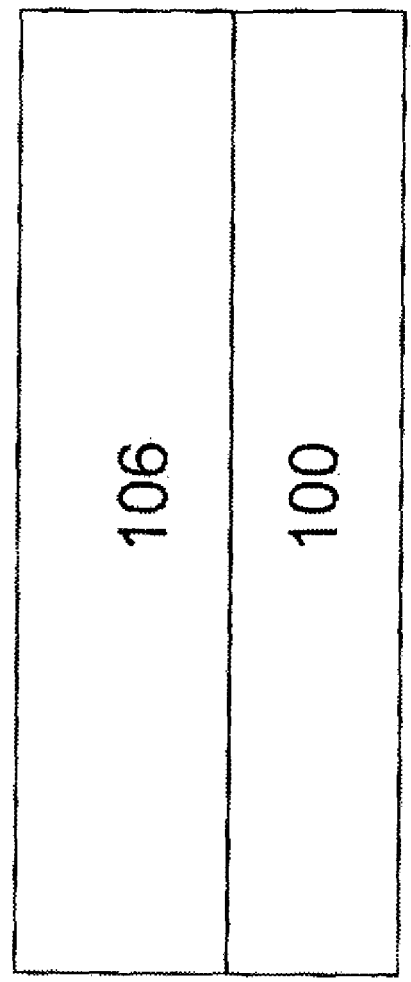
Figure 7:
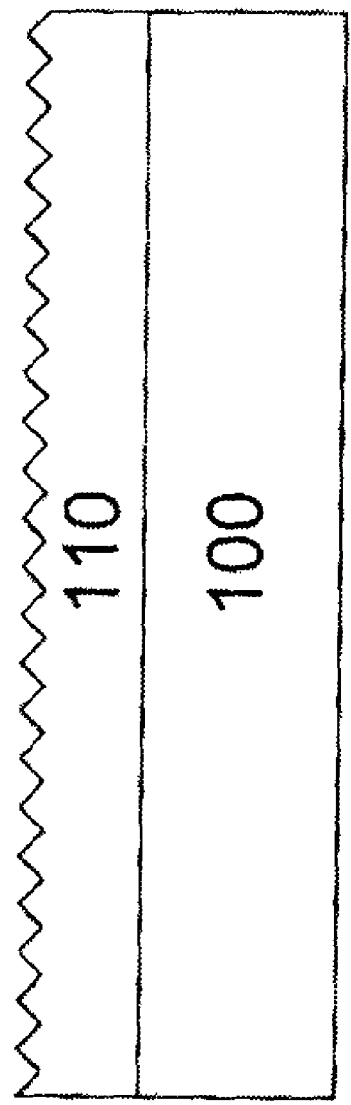

As shown in FIG. 6, the invention then removes the oxide layer 108 by a hydrofluoric acid etch. An example of an etchant for this process is a 10:1 $HF:H_2O$ solution. Next, as shown in FIG. 7, the invention non-selectively thins the SiGe layer 106 to a desired final thickness; the thinned SiGe layer is illustrated as layer 110 in FIG. 7. This non-selective thinning keeps the germanium concentration, the amount of relaxation, and stacking fault defect density unchanged. In other words, the thinning process non-selectively thins the SiGe layer such that the Si and Ge within the relaxed SiGe layer are removed proportionately. This way, the invention is able to obtain a thin SGOI film with high relaxation and low stacking fault defect density. While this disclosure discusses four different processes to non-selectively thin the SiGe layer, one ordinarily skilled in the art would understand that additional methods could be used.

In the first method, a HIPOX process at a temperature range of 550° C.-700° C. is used to non-selectively oxidize SiGe layer 106. The process pressure is typically at 1-50 ATM, preferably at 5-20 ATM. Steam is typically introduced to increase the oxidation rate. After oxidation, the oxide is removed by an HF etch. In the second method, an atmospheric pressure or reduced pressure steam oxidation process at a temperature range of 550° C.-700° C. is used to non-selectively oxidize SiGe layer 106. After oxidation, the oxide is removed by an HF etch. In the third method, an in-situ HCl etch in epitaxy chamber is used to thin SiGe layer 106. This etching is done following a typical epitaxy pre-clean, and before strained Si deposition. The etch process is performed at pressure between 1-760 Torr, temperature between 700° C.-900° C., and HCl flow between 50 sccm-10 slm. In the forth method, a chemical mechanical polishing (CMP) process is used to thin the SiGe layer 106.

Figure 8:
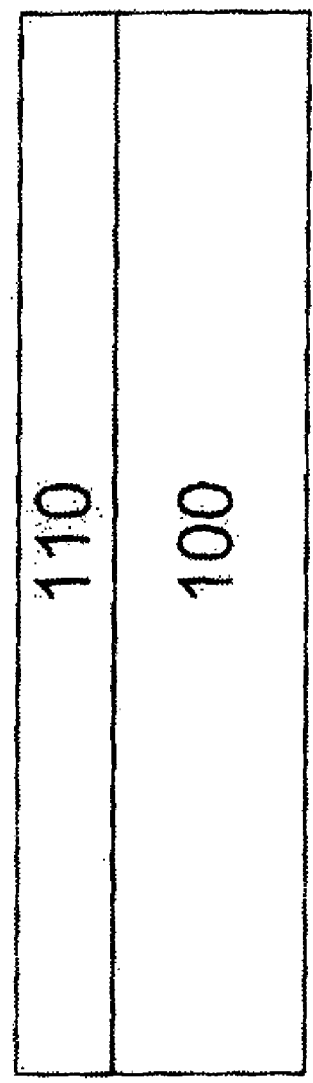

The SiGe layer 110, thinned by oxidation methods, as described by the first and second methods, is typically very rough. RMS measured by AFM typically shows 20-50 Å surface roughness. As shown in FIG. 8, a smoothing process is used to reduce the surface roughness of SiGe layer 110 to below 15 Å, preferably to below 10 Å. The following three smoothing methods can be used in addition to others, as would be understood by those skilled in the art.

In the first method, a touch-up CMP is used to reduce the surface roughness to below 10 Å. The SiGe removed during touch-up CMP is typically less than 200 Å, preferably less than 100 Å.

In the second method, an in-situ hydrogen bake and SiGe buffer layer before strained Si deposition is used to reduce the SiGe surface roughness to below 15 Å, preferably below 10 Å. The hydrogen bake process is typically performed at temperature range of 700° C.-900° C., preferably at 750° C.-850° C., at pressure of 1 Torr-300 Torr, preferably at 5 Torr-80 Torr, for 30 sec-300 sec, preferably 60 sec-120 sec. The SiGe buffer is grown for 20-500 Å, preferably 50-200 Å, at temperature of 550° C.-700° C. using $SiH_4$ and $GeH_4$ as source gas, or at temperature of 700° C.-850° C. using DCS and $GeH_4$ as source gas.

In the third method, an in-situ smoothening process is used by heating the wafer in a hydrogen environment with a mixture of gases of HCl, DCS and $GeH_4$, at temperature of 700° C.-900° C. The process smoothes the SiGe surface by performing a SiGe etching and depositing process.

Figure 9:
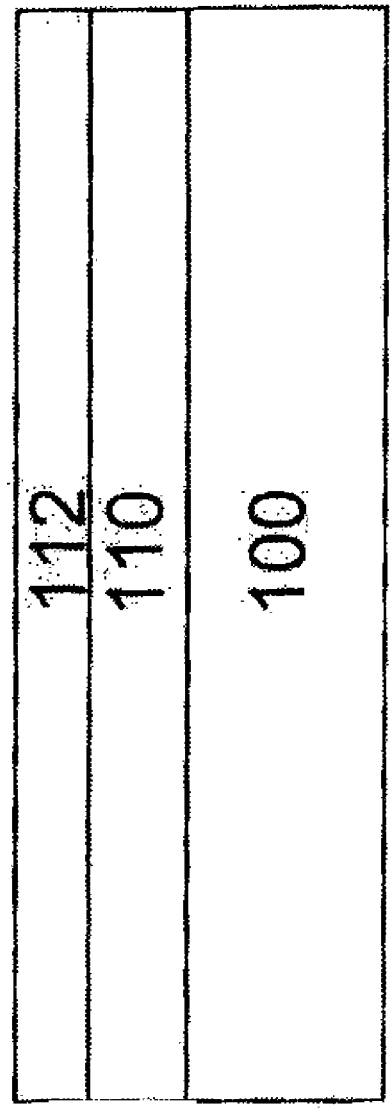

Finally, as shown in FIG. 9, the invention deposits strained Si 112 on the thinned SGOI wafer. The Si layer typically has a thickness of 50-300 Å.

Figure 10:
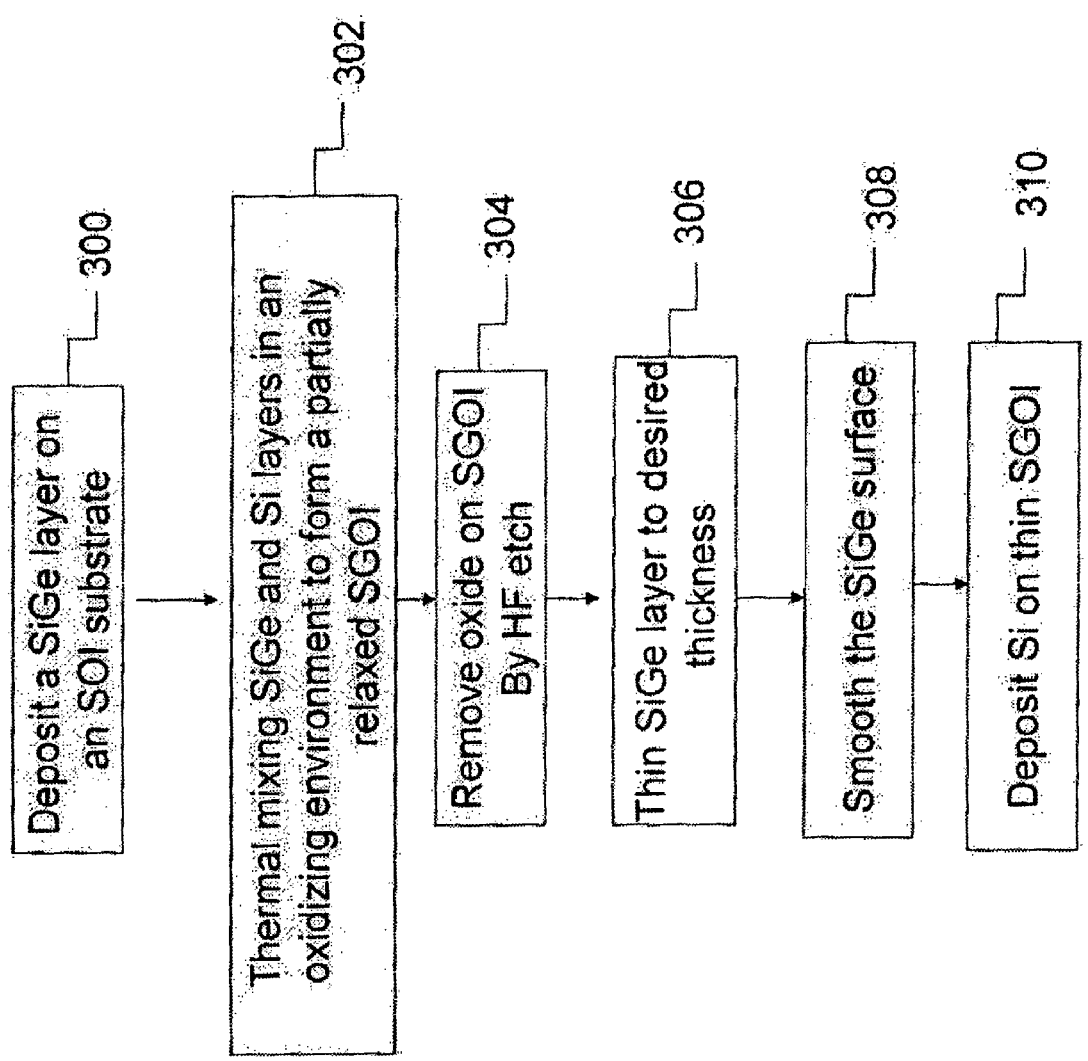
FIG. 10 is a flow diagram illustrating a preferred method of the invention.

FIG. 10 shows the invention in flowchart form. More specifically, the invention first deposits a SiGe layer on an SOI wafer 300. Next, the invention performs thermal mixing of the SiGe and Si layers 302 to form a partially relaxed SiGe on insulator. As mentioned above, the process of thermally mixing the SiGe and Si layers comprises heating the SiGe layer to approximately 1200° C.-1300° C. in an oxidizing environment. The invention then removes the oxide on SGOI using an HF etch 304. A non-selective SiGe thinning process is then carried out to reduce the SiGe thickness down to the desired thickness 306. This keeps the Ge concentration and the amount of relaxation unchanged regardless of the thickness of the SiGe layer. After the thinning process, the SiGe surface is smoothed 308. This way, the invention is able to obtain a thin SGOI film with high relaxation, and with low stacking fault defect density. Finally, the invention deposits Si on the thin SGOI wafer 310.

The present invention is applicable to the manufacture of high-performance semiconductor devices which include SGOI films. The invention has been described in terms of a full process of making thick SGOI by thermal mixing and thinning the thick SGOI to obtain a thin SGOI with high relaxation and low stacking fault defect density. However, as would be realized by those ordinarily skilled in the art, the SiGe thinning and smoothing techniques described in this invention can be applied to pre-formed SGOI wafers, such as SGOI wafers formed by film transferring technique. In such film transferring techniques, a partially or fully relaxed SiGe layer is first formed on a first wafer, and then transferred to a carrier wafer using wafer bonding, and an insulator layer is formed between the SiGe layer and the carrier wafer.

While the invention has been described in terms of preferred embodiments, those skilled in the art will recognize that the invention can be practiced with modification within the spirit and scope of the appended claims.

We claim:

1. A method of forming a strained Si layer on a SiGe-on-insulator (SGOI) structure with a low stacking fault defect density, the method comprising the steps of:
   providing a Si-on-insulator (SOI) substrate having an unstrained Si layer over an insulator;
   depositing a first SiGe layer on said Si layer;
   thermally mixing said first SiGe layer with said Si layer to transform said first SiGe layer and said Si layer into a relaxed SiGe layer of a first thickness;
   thinning said relaxed SiGe layer to a second thickness through an high-pressure oxidation (HIPOX) at temperature range of 550° C.-700° C. and pressure range of 5 ATM-20 ATM; and
   depositing a strained Si layer on said relaxed SiGe layer.

2. The method in claim 1, wherein said process of thermally mixing said first SiGe layer with said Si layer comprises heating said first SiGe layer and said Si layer to approximately 1200° C.-1300° C. in an oxidizing environment.

3. The method in claim 1, wherein said thinning process non-selectively thins said relaxed SiGe layer such that the Si and Ge within said relaxed SiGe layer are removed proportionately.

4. The method in claim 1, characterized in that said second thickness is less than 1000 Å.

5. The method in claim 1, characterized in that said SGOI is more than 60% relaxed.

6. The method in claim 1, characterized in that said SGOI has less than $1\times10^{-4}/cm^2$ of stacking fault defects.

7. The method in claim 1, characterized in that said second thickness is less than 500 Å.

8. The method in claim 1, characterized in that said SGOI is more than 80% relaxed.

9. The method in claim 1, characterized in that said SGOI has less than $1\times10^{-2}/cm^2$ of stacking fault defects.

10. The method in claim 1, further comprising smoothing said relaxed SiGe layer to reduce surface roughness of said SiGe.

11. The method in claim 10, wherein said smoothing comprises one of:
   a touch-up CMP;
   an in-situ hydrogen bake and SiGe buffer layer growth before depositing said strained Si layer; and
   heating said relaxed SiGe layer in a hydrogen environment with a mixture of gases of HCl, DCS and GeH$_4$, at temperature of 700° C.-900° C.

* * * * *